United States Patent
Melnik et al.

(10) Patent No.: US 6,616,757 B1
(45) Date of Patent: Sep. 9, 2003

(54) METHOD FOR ACHIEVING LOW DEFECT DENSITY GAN SINGLE CRYSTAL BOULES

(75) Inventors: Yuri V. Melnik, Rockville, MD (US); Vitali Soukhoveev, Gaithersburg, MD (US); Vladimir Ivantsov, Gaithersburg, MD (US); Katie Tsvetkov, Gaithersburg, MD (US); Vladimir A. Dmitriev, Gaithersburg, MD (US)

(73) Assignee: Technologies and Devices International, Inc., Gaithersburg, MD (US)

( * ) Notice: Subject to any disclaimer, the term of this patent is extended or adjusted under 35 U.S.C. 154(b) by 0 days.

(21) Appl. No.: 09/903,298

(22) Filed: Jul. 11, 2001

Related U.S. Application Data

(63) Continuation of application No. 09/900,833, filed on Jul. 6, 2001, now abandoned.

(51) Int. Cl.$^7$ .......................... C30B 25/02; C30B 25/04
(52) U.S. Cl. .......................... 117/102; 117/89; 117/93; 117/99; 117/100; 117/105; 438/478
(58) Field of Search .............................. 117/89, 93, 99, 117/100, 102, 105; 438/478

(56) References Cited

U.S. PATENT DOCUMENTS

| | | | |
|---|---|---|---|
| 5,322,592 A | 6/1994 | Beckers et al. | 117/80 |
| 5,679,152 A | 10/1997 | Tischler et al. | 117/97 |
| 5,770,887 A | 6/1998 | Tadatomo et al. | 257/613 |
| 5,875,769 A | 3/1999 | Toyama et al. | 125/16.01 |
| 5,935,321 A | 8/1999 | Chiou et al. | 117/13 |
| 6,006,738 A | 12/1999 | Itoh et al. | 125/21 |
| 6,056,817 A | 5/2000 | Uchida et al. | 117/4 |
| 6,136,093 A | 10/2000 | Shiomi et al. | 117/4 |
| 6,139,631 A | 10/2000 | Kato | 117/200 |
| 6,146,457 A | 11/2000 | Solomon | 117/90 |
| 6,177,292 B1 | 1/2001 | Hong et al. | 438/46 |
| 6,177,688 B1 | 1/2001 | Linthicum et al. | 257/77 |
| 6,218,280 B1 | 4/2001 | Kryliouk et al. | 438/607 |

Primary Examiner—Felisa Hiteshew
(74) Attorney, Agent, or Firm—Bingham McCutchen LLP; David G. Beck

(57) ABSTRACT

A method for growing bulk GaN and AlGaN single crystal boules, preferably using a modified HVPE process, is provided. The single crystal boules typically have a volume in excess of 4 cubic centimeters with a minimum dimension of approximately 1 centimeter. If desired, the bulk material can be doped during growth to achieve n-, i-, or p-type conductivity. In order to have growth cycles of sufficient duration, preferably an extended Ga source is used in which a portion of the Ga source is maintained at a relatively high temperature while most of the Ga source is maintained at a temperature close to, and just above, the melting temperature of Ga. To grow large boules of AlGaN, preferably multiple Al sources are used, the Al sources being sequentially activated to avoid Al source depletion and excessive degradation. In order to achieve high growth rates, preferably a dual growth zone reactor is used in which a first, high temperature zone is used for crystal nucleation and a second, low temperature zone is used for rapid crystal growth. Although the process can be used to grow crystals in which the as-grown material and the seed crystal are of different composition, preferably the two crystalline structures have the same composition, thus yielding improved crystal quality.

27 Claims, 3 Drawing Sheets

METHOD FOR ACHIEVING LOW DEFECT DENSITY GAN SINGLE CRYSTAL BOULES

PRIORITY CLAIM

The present application is, continuation of U.S. patent application Ser. No. 09/900,833, filed Jul. 6, 2001, now abandoned for "Method for Fabricating Bulk GaN Single Crystals" and as such claims benefit of the earlier filing date.

FIELD OF THE INVENTION

The present invention relates generally to semiconductor materials and, more particularly, to a method for growing bulk single crystals.

BACKGROUND OF THE INVENTION

Recent results in the development of GaN-based light-emitting diodes (LEDs) and laser diodes (LDs) operating in the green, blue, and ultraviolet spectrum have demonstrated the tremendous scientific and commercial potential of group III nitride semiconductors (e.g., GaN, AlN, InN, and their alloys). These applications require electrically conducting substrates (e.g., GaN or AlGaN) so that a vertical device geometry can be utilized in which the electrodes are located on the top and bottom surfaces of the device structure. In addition to opto-electronic devices, group III nitride semiconductors can be used in a host of other applications such as communication electronics (e.g., high power microwave devices). These devices require electrically insulating substrates.

In order to achieve the desired device performance (e.g., high efficiency, low leakage current, high device yield, long lifetime, etc.) for devices fabricated from group III nitride semiconductor materials, it is expected that such devices will have to be fabricated on native GaN or AlGaN substrates. Native substrates as used herein refers to substrates that have been obtained from bulk material, the bulk material preferably grown from seeds of the same composition, thus allowing the substrates to achieve extremely low defect densities as well as low residual stress levels. Unfortunately, due to the lack of bulk GaN and AlGaN substrates, device developers have been forced to attempt various work-around solutions.

Initially GaN-based structures were developed on foreign substrates. Some of the substrates that have been used in these attempts are sapphire, silicon carbide, ZnO, $LiGaO_2$, $LiAlO_2$, and $ScMgAlO_4$. These devices suffer from a high defect density including a high density of dislocations, domains, and grain boundaries. Additionally, these devices suffer from cracking and bending of the epitaxial structures. Most of these problems arise from the lattice and thermal mismatch between the foreign substrates and the GaN-based device structures. As a result, these devices exhibit greatly reduced performance.

In order to attempt to overcome the problems in growing a GaN-based device on a foreign (i.e., non-GaN) substrate, a number of developers have attempted to grow GaN single crystals suitable for use with microelectronic device structures. For example, U.S. Pat. No. 5,679,152 discloses a technique for growing a GaN layer on a sacrificial substrate and then etching away the substrate. As disclosed, the substrate is etched away in situ while the substrate/GaN layer is at or near the growth temperature. The GaN layer may be deposited directly on the sacrificial substrate or deposited on an intermediate layer that has been deposited on the substrate.

Alternately, U.S. Pat. No. 5,770,887 discloses a repetitive growth technique utilizing alternating epitaxially grown layers of a buffer material and GaN single crystal. Removing the buffer layers, for example by etching, produces a series of GaN single crystal wafers. The patent discloses using sapphire as the initial seed crystal and a material such as BeO, MgO, CaO, ZnO, SrO, CdO, BaO or HgO as the buffer layer material.

Another technique for growing GaN substrates is disclosed in U.S. Pat. No. 6,146,457. As disclosed, a thick layer of GaN is epitaxially deposited on a thin, disposable substrate using a CVD process. In the preferred embodiment, the substrate (e.g., sapphire) has a thickness of 20–100 microns while the GaN epitaxial layer has a thickness of 50–300 microns. Accordingly, upon material cooling, the strain arising from the thermal mismatch of the material is relieved by cracking the disposable substrate rather than the newly deposited epitaxial layer. As noted by the inventors, however, the disclosed process solves the problems associated with thermal mismatch, not lattice mismatch.

U.S. Pat. No. 6,177,292 discloses a method for growing a GaN group material on an oxide substrate without cracking. After the growth of the GaN group material, a portion of the oxide substrate is removed by mechanical polishing. Another GaN layer is then grown on the initial GaN layer to provide further support prior to the complete removal of the remaining oxide substrate. As a result of this process, a stand-alone GaN substrate is formed that can be used as a substrate for the growth of a micro-electronic device.

U.S. Pat. No. 6,218,280 discloses a method and apparatus for depositing III–V compounds that can alternate between MOVPE and HVPE processes, thus not requiring that the substrate be cooled and transported between the reactor apparatus during device growth. As disclosed, the MOVPE process is used to grow a thin III–V nitride compound semiconductor layer (e.g., a GaN layer) on an oxide substrate (e.g., $LiGaO_2$, $LiAlO_2$, $MgAlScO_4$, $Al_2MgO_4$, and $LiNdO_2$). The HVPE process is then used to grow the device structure on the GaN layer.

The main problems associated with growing true bulk GaN or AlGaN crystals relate to fundamental properties of the materials. For example, sublimation growth of GaN is limited by the incongruent decomposition of GaN that becomes noticeable at temperatures from 800° C. to 1100° C. In U.S. Pat. No. 6,136,093, a technique is disclosed for growing GaN on a GaN seed. As disclosed, Ga is heated to or above the evaporation temperature of Ga and the seed crystal is heated to a temperature higher than that of the Ga. The Ga vapor then reacts with a nitrogen containing gas to form GaN which is deposited on the seed crystal.

Another method to grow bulk GaN crystals is to grow them from the liquid phase. The main problem associated with liquid phase growth of GaN is the extremely low solubility of nitrogen in melts in general, and in Ga melts in particular. The low solubility limits the GaN growth rate and results in small volume GaN crystals, generally less than 0.2 cubic centimeters.

In order to overcome the low solubility of nitrogen in the Ga melts, typically growth temperatures between 1500° C. and 1600° C. are used with a nitrogen gas pressure in the range of 10 to 20 kilobars. Even at these high pressures and temperatures, nitrogen solubility in the Ga melt is very low. As a result, only growth rates of approximately 0.01 to 0.05 millimeters per hour can be obtained. Lateral growth rate, i.e., the growth rate perpendicular to the [0001] crystallographic direction, is typically about 1 millimeter per day. In addition to the low growth rates, due to the high temperatures and pressures it is difficult to develop production techniques using this process.

Accordingly, although III–V nitride compound semiconductor materials offer tremendous potential for a variety of micro-electronic devices ranging from opto-electronic devices to high-power, high-frequency devices, the performance of such devices is limited by the lack of suitable substrates. The present invention provides a method for fabricating suitable substrates.

SUMMARY OF THE INVENTION

The present invention provides a method and apparatus for growing bulk GaN and AlGaN single crystal boules, preferably using a modified HVPE process. The single crystal boules fabricated in accordance with the present invention typically have a volume in excess of 4 cubic centimeters with a minimum dimension (i.e., x, y, or z dimension) of approximately 1 centimeter.

According to one aspect of the invention, an extended Ga source is located within a reactor such that a portion of the Ga source is maintained at a relatively high temperature while most of the Ga source is maintained at a temperature close to, and just above, the melting temperature of Ga. In at least one embodiment of the invention, in order to obtain the desired temperature spread in the Ga source, a portion of the source tube extends outside of the reactor. Assuming the use of a modified HVPE process for the growth of the single crystal boule, preferably the high temperature is in the range of 450° C. to 850° C., and more preferably at a temperature of approximately 650° C., while the low temperature is less than 100° C. and preferably in the range of 30° C. to 40° C. As a result of this source configuration, the amount of Ga undergoing a reaction is controllable and limited, thus allowing extended growth cycles to be realized without experiencing degradation in the as-grown material.

In another aspect of the invention, an extended Al source, preferably comprised of one or more individual Al sources, is included in the reactor, thereby allowing the growth of AlGaN boules. Although a single Al source can be used, in order to accomplish the desired extended growth cycles, thereby allowing the growth of large single crystal boules, multiple Al sources are used. If multiple Al sources are used, they are sequentially activated. Accordingly, as one Al source begins to degrade and/or become depleted, another Al source is activated and the first source is deactivated. The cycling of Al sources continues as long as necessary in order to complete the growth process.

In at least one embodiment of the invention, the reactor is at least partially surrounded by a multi-temperature zone furnace. The reactor includes at least one, and preferably two, growth zones. One of the growth zones is maintained at a high temperature, preferably within the range of 1,000° C. to 1,100° C. This growth zone is preferably used to initiate crystalline growth. Although the high temperature of this zone allows high quality crystal growth, the growth rate at this temperature is relatively low. Accordingly a second growth zone, preferably held to a temperature within the range of 850° C. to 1,000° C., is used after crystal growth is initiated. The crystal growth rate at this temperature is relatively high.

In at least one embodiment of the invention, the reactor includes an extended Ga source within one source tube, the Ga source tube connected to a source of a halide gas (e.g., HCl) and to a source of an inert gas (e.g., Ar). During the growth cycle, the halide gas is introduced into the Ga source tube where it primarily reacts with the Ga held at a high temperature. As a result of the reaction, a halide metal compound is formed which is delivered to the growth zone by the inert gas. Simultaneously, ammonia gas is delivered to the growth zone. As a result of the reaction of the halide metal compound and the ammonia gases, GaN is deposited on one or more seed substrates within the growth zone. By simultaneously supplying aluminum trichloride to the growth zone, for example by reacting an Al source with HCl, AlGaN is grown on the seed crystals within the growth zone. Additionally, by supplying a suitable dopant to the growth zone during the growth cycle, GaN or AlGaN of n-, i-, or p-type conductivity can be grown.

In at least one embodiment of the invention, in order to achieve superior quality in a single crystal boule of GaN or AlGaN, a repetitive growth cycle is used. During the first growth cycle, a single crystal of the desired material (e.g., GaN or AlGaN) is grown on a seed substrate of a different chemical composition. Suitable seed crystals include sapphire, silicon carbide, and gallium arsenide (GaAs). After completion of a relatively lengthy growth cycle, preferably of sufficient duration to grow a single crystal several millimeters thick, the substrate is removed. The remaining crystal is then subjected to suitable surface preparatory steps. This crystal is then used as the seed crystal for another extended growth cycle, preferably of sufficient duration to grow a single crystal boule of approximately 1 centimeter in thickness.

A further understanding of the nature and advantages of the present invention may be realized by reference to the remaining portions of the specification and the drawings.

DESCRIPTION OF THE SPECIFIC EMBODIMENTS

Figure 1:
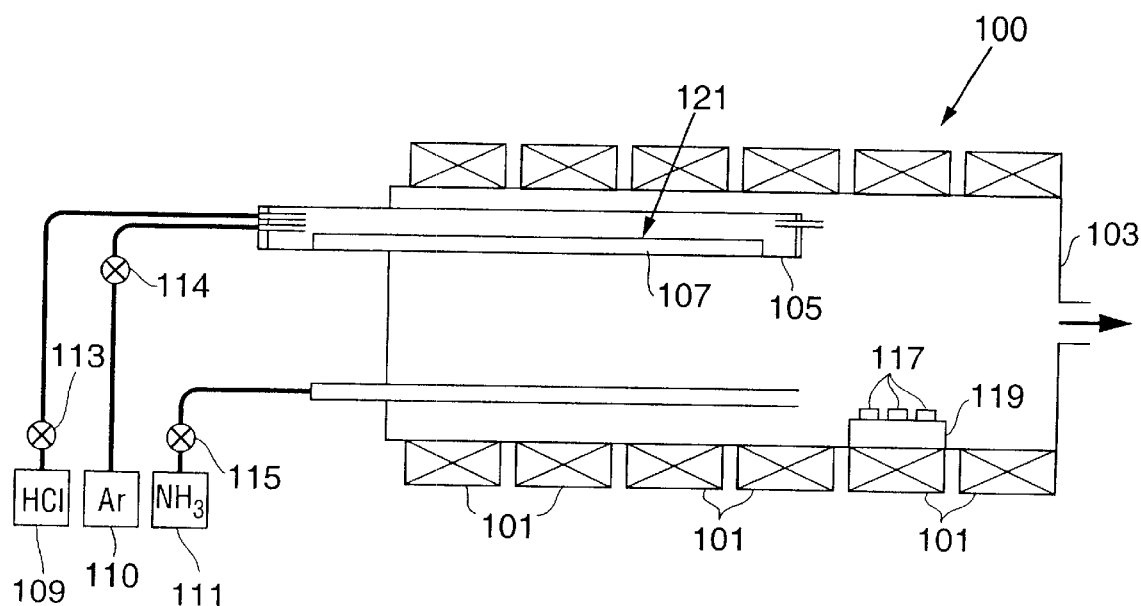
FIG. 1 is a schematic illustration of a horizontal furnace as used with the invention.

The present invention provides a method and apparatus for growing bulk gallium nitride (GaN) or aluminum gallium nitride (AlGaN), preferably using a modified hydrid vapor phase epitaxial (HVPE) approach. FIG. 1 is a schematic illustration of a horizontal furnace as used with the invention. It is understood that the invention is not limited to this particular furnace configuration as other configurations (e.g., vertical furnaces) that offer the required control over the temperature, temperature zone or zones, gas flow, source and substrate location, source configuration, etc., can also be used. The furnace configuration illustrated in FIG. 1 is preferred for the growth of undoped GaN as it easily accommodates the desired gallium source of the invention.

Furnace 100 is comprised of multiple temperature zones, preferably obtained through the use of multiple heaters 101, each of which at least partially surrounds reactor tube 103. In the preferred embodiment, a six zone configuration is used in which heaters 101 are resistive heaters. It is understood that although reactor tube 103 preferably has a cylindrical cross-section, other configurations can be used such as a 'tube' with a rectangular cross-section. Within reactor tube 103 are one or more source tubes 105. As noted with respect to reactor tube 103, although source tubes 105 preferably have a cylindrical cross-section, the invention is not limited to cylindrical source tubes.

Figure 2:
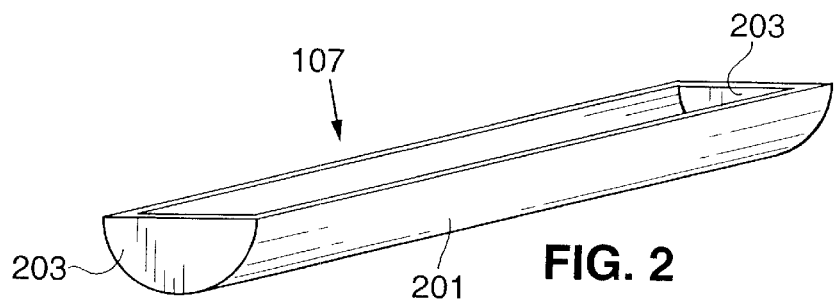
FIG. 2 is an illustration of one embodiment of a boat suitable for use with the furnace shown in FIG. 1.

In order to grow undoped bulk GaN, a single source tube 105 is required. Within source tube 105 is a source boat 107. As used herein, the term "boat" simply refers to a means of holding the source material. For example, boat 107 may be comprised of a portion of a tube 201 with a pair of end portions 203 as illustrated in FIG. 2. Alternately, the source material can be held within source tube 105 without the use of a separate boat 107. Alternate boat configurations are clearly envisioned by the inventors.

Figure 3:
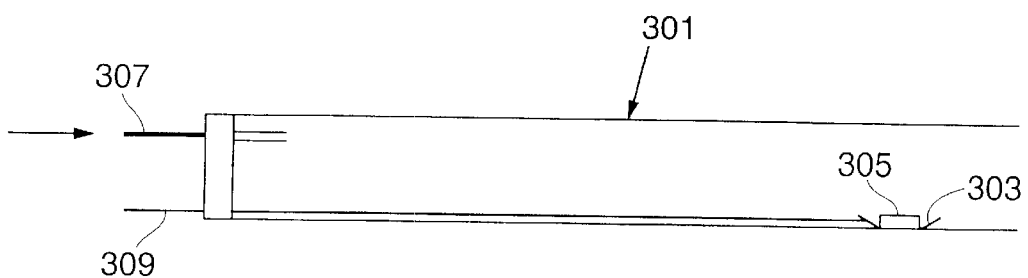
FIG. 3 is an illustration of an individual source tube and a means of varying the source contained within the tube relative to the reactor.

As described in detail below, in the preferred embodiment of the invention the desired growth temperature depends upon the stage of crystal growth (e.g., crystal nucleation versus high growth rate). The temperature of a source in general, and the temperature of a specific portion of the gallium source in particular, are preferably controlled by varying the heat applied by specific heaters 101. Additionally, in the preferred embodiment of the invention in which multiple source types are used, the location of a particular source (e.g., an impurity source) relative to reactor tube 103 can be controllably varied, typically by altering the position of the source. For example, as illustrated in FIG. 3, a source tube 301 typically includes a boat 303, a source 305 within boat 303, and a gas inlet 307. A control rod 309 coupled to boat 303 can be used to alter the position of the boat, and thus the source, within the reactor. Control rod 309 can be manually manipulated, as provided for in the illustrated configuration, or coupled to a robotic positioning system (not shown).

In the preferred embodiment, coupled to each source tube are one or more sources of gas 109–111. The rate of gas flow through a particular source tube is controlled via valves 113–115, either manually or by an automatic processing system.

A substrate 117 is located on a pedestal 119 within the growth zone of reactor 103. Although typically multiple substrates 117 are manually loaded into the reactor for co-processing, a single substrate can be processed with the invention. Additionally, substrates 117 can be automatically positioned within the furnace for automated production runs. In order to vary the temperature of the growth zone, and thus substrate or substrates 117, either the position of the substrates relative to reactor 103 are changed or the amount of heat applied by heaters 101 proximate to the growth zone is varied.

Figure 4:
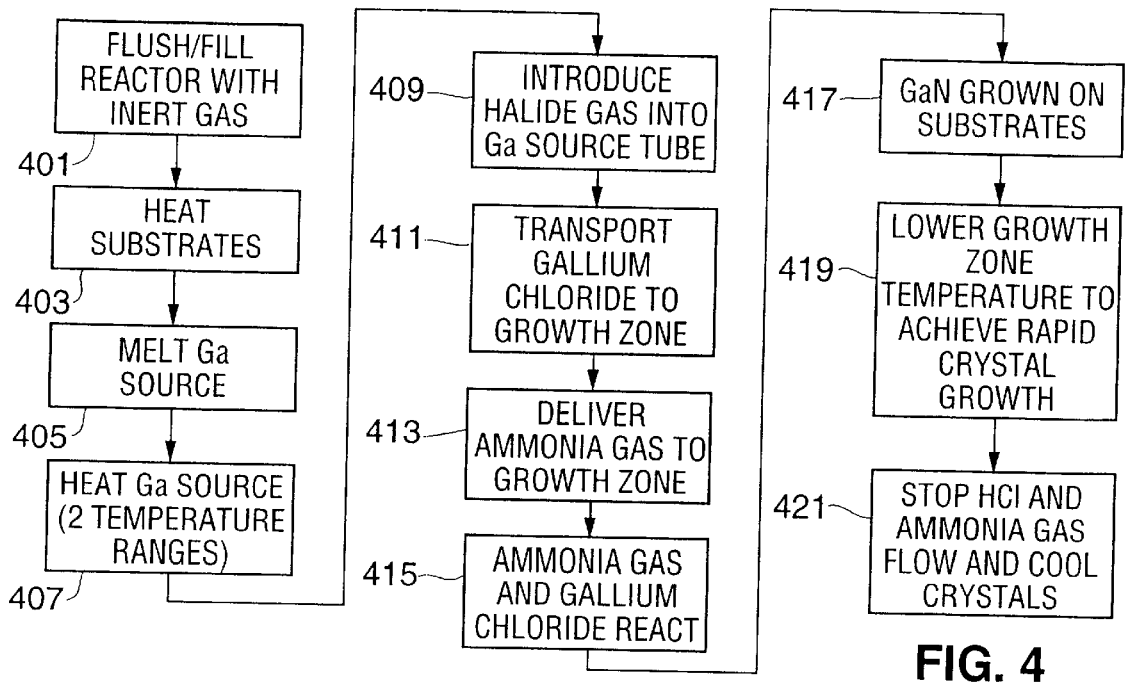
FIG. 4 is a block diagram outlining the preferred method of fabricating bulk GaN according to the invention.

FIGS. 1 and 4 illustrate a specific reactor 100 and the steps used to grow bulk GaN, respectively. Although reactor 100 is a hot-wall, horizontal reactor and the process is carried out in an inert gas flow at atmospheric pressure, as previously noted other reactor configurations can be used to perform the modified HVPE process of the invention. Preferably source tube 105 and source boat 107 are comprised of quartz. Other materials can be used for boat 107, however, such as sapphire or silicon carbide. Within boat 107, or simply within tube 105 if no separate boat is used, is a Ga metal source 121.

In order to achieve extended GaN growth, as required to grow bulk GaN, the inventors have found that an extended source of Ga must be used and that the extended source must be maintained at more than one temperature. Specifically, Ga metal 121 is positioned relative to reactor 103 such that a large quantity of source 121 (i.e., preferably greater than 90 percent of source 121) is maintained at a relatively low temperature, preferably less than 100° C. and more than the melting temperature of Ga (i.e., 29.78° C.), and more preferably within the temperature range of 30° C. to 40° C. Due to the low temperature, this portion of Ga source 121 has limited reaction with the halide reactive gas coupled to and flowing through source tube 105. If desired, as in the preferred embodiment, a portion of source tube 105 and Ga source 121 are maintained outside of the reactor volume as illustrated in FIG. 1. Alternately, the lower temperature of this portion of source 121 is achieved through control of heaters 101 adjacent to the lower temperature portion of the source.

At the high temperature end of source tube 105, the temperature of Ga source 121 is held at a relatively high temperature, typically between 450° C. and 850° C. and preferably at a temperature of approximately 650° C. During crystal growth, a constant source of Ga is maintained due to the flow of Ga from the low temperature portion of tube 105 to the higher temperature portion of tube 105. Accordingly, by providing a large Ga source, the present invention allows the growth of bulk GaN while limiting the amount of the source that reacts with the halide reactive gas. It is understood that although the preferred embodiment of the invention utilizes a modified HVPE process in conjunction with the large Ga source described above, the source can be used with other bulk growth techniques (e.g., sublimation techniques).

In order to grow bulk GaN according to the preferred embodiment of the invention, a source of halide gas 109, preferably HCl, is coupled to source tube 105 along with a source of inert gas 110, preferably Ar. A source of ammonia gas 111 is also coupled to reactor 103. In order to grow bulk GaN, preferably seed crystals 117 are comprised of GaN, thus providing a lattice and coefficient of thermal expansion match between the seed and the material to be grown. As a result of using GaN seed crystals, improved quality in the as-grown material is achieved. Alternately, seed crystals 117 can be of silicon carbide (SiC), sapphire, gallium arsenide (GaAs), or other material. Seed crystal pedestal 119 is preferably fabricated from quartz, although other materials such as silicon carbide or graphite can also be used.

Initially reactor 103 is flushed and filled with an inert gas, preferably Ar, from gas source 110 (step 401). The inert gas can enter the reactor through source tube 105, thereby flushing the source tube, through a separate entry line (not shown), or both. The flow of inert gas is controlled by metering valve 114 and is typically in the range of 1 to 25 liters per minute. Substrates (or substrate) 117 are then heated to the desired growth temperature (step 403). In one embodiment of the invention the growth zone, and thus the substrates within the growth zone, are heated to a temperature within the range of 1,000° C. and 1,100° C. This temperature achieves a higher quality material in the as-grown crystal, but yields relatively slow growth rate. In an alternate embodiment, the growth zone is maintained at a temperature within the range of 850° C. and 1,000° C. Although this temperature is capable of fast crystal growth, the resulting crystal is of lower quality. In the preferred embodiment of the invention, the methodology of which is illustrated in FIG. 4, the growth zone and thus the substrates (or substrate) within the growth zone are initially heated to a high temperature within the range of 1,000° C. and 1,100° C., thus initiating high quality crystal growth. Once crystal growth has been initiated, the source temperature is lowered and maintained at a temperature within the range of 850° C. and 1,000° C., thus allowing rapid crystal growth to be achieved. Preferably the period of high quality crystal growth is at least 10 minutes and the period of rapid crystal growth is at least 12 hours. More preferably the period of high quality crystal growth is at least 30 minutes and the period of rapid crystal growth is at least 24 hours.

Preferably prior to initiating crystal growth, the surfaces of substrates 117 are etched to remove residual surface contamination, for example by using gaseous HCl from supply 109. The Ga source material 121 is initially heated to a temperature sufficient to cause the entire source to melt (step 405). As previously noted, the melting temperature of Ga is 29.78° C. and source 121 is preferably heated to a temperature within the range of 30° C. to 40° C. A portion of source tube 105 closest to substrates 117, and thus the portion of source material 121 closest to substrates 117, is heated to a relatively high temperature (step 407), typically between 450° C. and 850° C. and preferably at a temperature of approximately 650° C.

After the source material is heated a halide reactive gas, preferably HCl, is introduced into source tube 105 (step 409). As a result of the reaction between HCl and Ga, gallium chloride is formed which is transported to the reactor's growth zone by the flow of the inert (e.g., Ar) gas (step 411). Simultaneously, ammonia gas (NH$_3$) from source 111 is delivered to the growth zone (step 413). The NH$_3$ gas and the gallium chloride gas react (step 415) to form GaN on the surface of seed substrates 117 (step 417). The initial growth rate of the GaN is in the range of 0.05 to 1 micron per minute. After a high quality GaN layer of sufficient thickness has been grown, typically on the order of 20 microns and preferably on the order of 50 microns, the temperature of the growth zone is lowered (step 419) to a temperature within the range of 850°C. and 1,000° C., thereby allowing GaN to be grown at an accelerated rate (i.e., in the range of 5 to 500 microns per hour). After the desired boule thickness has been achieved, the flow of HCl and NH$_3$ gas is stopped and substrates 117 are cooled in the flowing inert gas (step 421).

Figure 6:
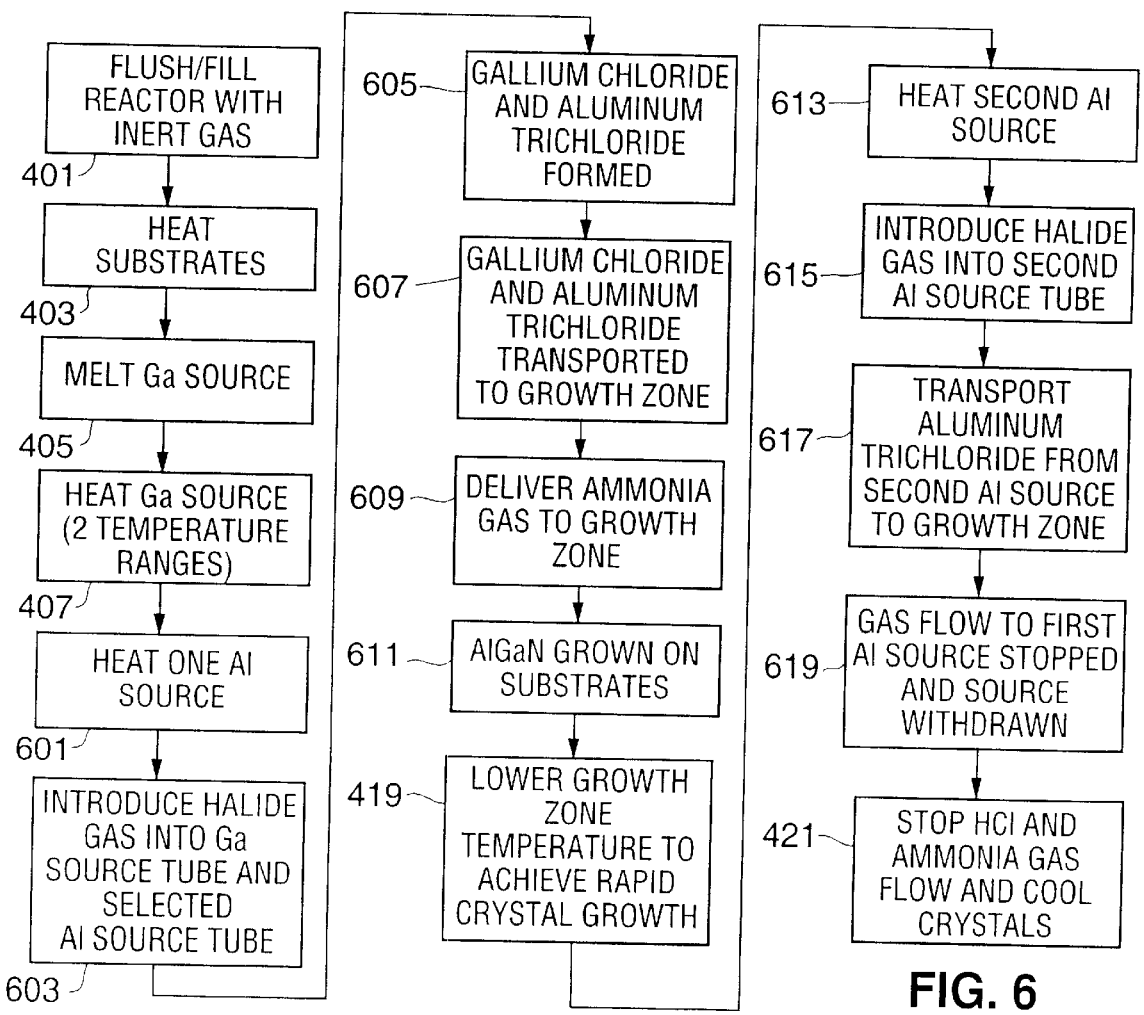
FIG. 6 is a block diagram outlining the preferred method of fabricating bulk AlGaN according to the invention.
Figure 5:
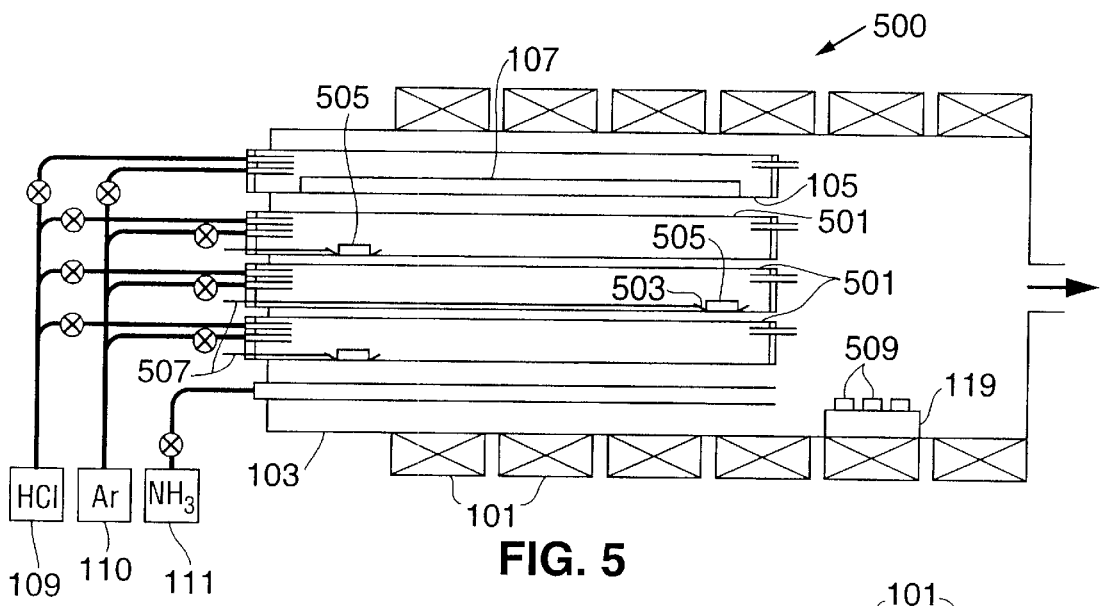
FIG. 5 is a schematic illustration of an alternate embodiment for use in growing AlGaN.

FIGS. 5 and 6 illustrate another embodiment of the invention that can be used to grow AlGaN boules. Reactor 500 is substantially the same as reactor 100 except for the inclusion of an aluminum (Al) source. Also in this embodiment Ga source tube 105 is shown to be completely within the reactor. As the Al source tends to degrade over time due to the reaction between the Al and the source tube/boat materials, in the preferred embodiment of the invention, reactor 500 includes multiple Al sources. As shown, reactor 500 includes three Al source tubes 501, although it is understood that fewer or greater numbers of Al source tubes can be included, depending upon the quantity of AlGaN to be grown. Within each Al source tube-501 is a source boat 503 containing a quantity of Al metal 505. Preferably each source boat 503 is fabricated from sapphire or silicon carbide. Additionally, as discussed with reference to FIG. 3, the position of each source boat 503 within the reactor can be altered using either a manual or automatic control rod 507.

As previously noted, preferably the seed crystal is of the same material as the crystal to be grown. Therefore in order to grow bulk AlGaN, preferably seed crystal 609 is fabricated of AlGaN. Alternately, seed crystal 609 can be of GaN, SiC, sapphire, GaAs, or other material.

The methodology to grow AlGaN is very similar to that outlined in FIG. 4 for GaN growth. In this embodiment, during source heating one of the Al sources 505 is heated to a temperature of preferably between 700° C. and 850° C. (step 601), the selected Al source being appropriately positioned within the reactor to achieve the desired temperature. Once all of the materials have achieved the desired growth temperature, halide gas (e.g., HCl) is introduced into Ga source tube 105 and the selected Al source tube (step 603). As a result, gallium chloride and aluminum trichloride are formed (step 605). Both the gallium chloride and aluminum chloride are transported to the growth zone using an inert gas (e.g., Ar) (step 607). NH$_3$ gas 111 is simultaneously introduced into the growth zone with the source materials (step 609) resulting in a reaction by the three gases to form AlGaN (step 611). As in the prior embodiment, preferably the growth zone is initially held at a higher temperature in order to initiate the growth of high quality material. Once a sufficiently large layer is formed, preferably on the order of 50 microns thick, the temperature of the growth zone is lowered (step 419) to a temperature within the range of 850° C. and 1,000° C. in order to achieve accelerated growth. Prior to exhaustion or excessive degradation of the initially selected Al source, a second Al source 503 is heated to a temperature within the preferred range of 700° C. and 850° C. (step 613). Once the second Al source is heated, halide gas (e.g., HCl) is introduced into the second Al source tube (step 615) and the resultant aluminum trichloride is transported to the growth zone (step 617). The flow of halide and inert gas through the initially selected Al source tube is then stopped and the first Al source is withdrawn from the high temperature zone (step 619). The process of introducing new Al sources continues as long as necessary to grow the desired AlGaN boule. After the desired boule thickness has been achieved, the flow of HCl and NH$_3$ gas is stopped and substrates 117 are cooled in the flowing inert gas (step 421).

Figure 7:
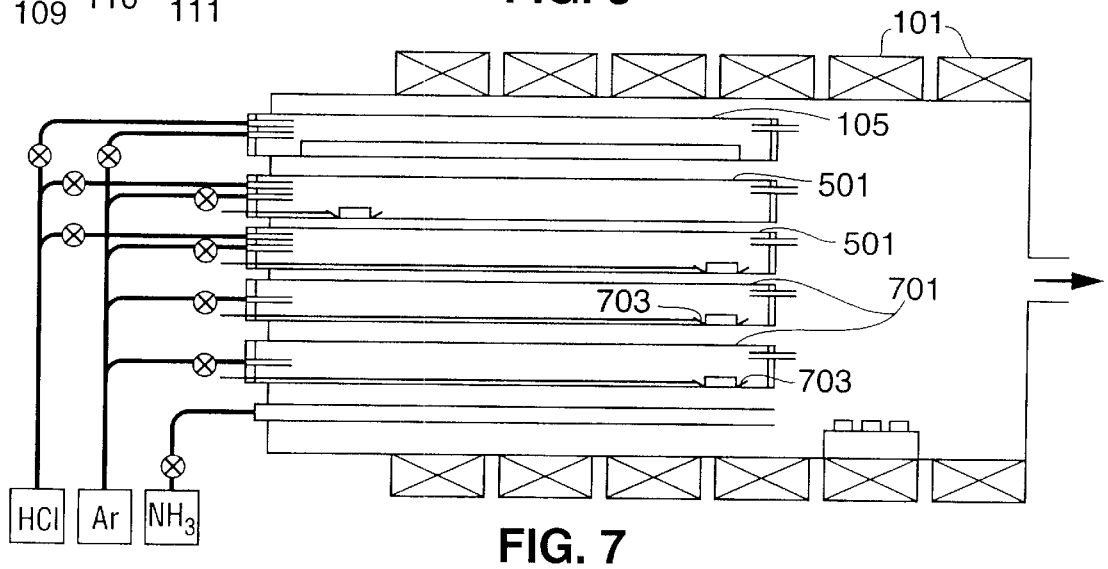
FIG. 7 is a schematic illustration of an alternate embodiment for use in growing doped material.

The present invention can be used to grow GaN or AlGaN of various conductivities, the conductivity dependent upon the dopants added during crystal growth. FIG. 7 illustrates another embodiment of the invention that allows the addition of dopants during crystal growth. The embodiment shown includes Ga source tube 105, two Al source tubes 501, and two dopant source tubes 701. It is understood that the number of source tubes is based on the number of constituents required for the desired crystal.

To grow p-type GaN or AlGaN, a suitable dopant (i.e., acceptor) is placed within one or more boats 703 within one or more dopant source tubes 701, thus allowing the desired dopants to be added to the crystal during growth. Preferably either magnesium (Mg) or a combination of Mg and zinc (Zn) is used. If multiple dopants are used, for example both Mg and Zn, the dopants may be in the form of an alloy, and thus be located within a single boat, or they may be in the form of individual materials, and thus preferably located within separate boats. To grow insulating (i.e., i-type) GaN or AlGaN, preferably Zn is used as the dopant. Although undoped GaN and AlGaN exhibit low n-type conductivity, controllable n-type conductivity can be achieved by doping the growing crystal with donors. Preferred donors include silicon (Si), germanium (Ge), tin (Sn), and oxygen (O).

A detailed discussion of GaN and AlGaN doping is provided in co-pending U.S. patent application Ser. No. 09/861,011, pages 7–14, the teachings of which are hereby incorporated by reference for any and all purposes. In the preferred embodiment of the invention, dopant source boats 703 are formed of non-reactive materials (e.g., sapphire), extremely pure source materials are used (e.g., 99.999 to 99.9999 purity Mg), and the source materials are etched prior to initiating the growth process to insure minimal surface contamination. Although the temperature for a particular dopant source depends upon the selected material, typically the temperature is within the range of 250° C. to 1050° C. If a Mg dopant is used, preferably the temperature is within the range of 450° C. to 700° C., more preferably within the range of 550° C. to 650° C., and still more preferably at a temperature of approximately 615° C. The dopant source or sources are heated simultaneously with the substrate and the Ga or the Ga and Al sources. The dopants are delivered to the growth zone via inert gas (e.g., Ar) flow. The flow rate depends upon the conductivity to be achieved in the growing crystal. For example, for growth of p-type GaN or AlGaN, the flow rate for a Mg dopant is typically between 1,000 and 4,000 standard cubic centimeters per minute, and preferably between 2,000 and 3,500 standard cubic centimeters per minute.

As previously described, the level of doping controls the conductivity of the grown material. In order to achieve p-type material, it is necessary for the acceptor concentration ($N_a$) to be greater than the donor concentration ($N_d$). The inventors have found that in order to achieve the desired $N_a/N_d$ ratio and grow p-type GaN or AlGaN, the concentration of the acceptor impurity must be in the range of $10^{18}$ to $10^{21}$ atoms per cubic centimeter, and more preferably in the range of $10^{19}$ to $10^{20}$ atoms per cubic centimeter. For an i-type layer, the doping level must be decreased, typically such that the dopant concentration does not exceed $10^{19}$ atoms per cubic centimeter.

Figure 8:
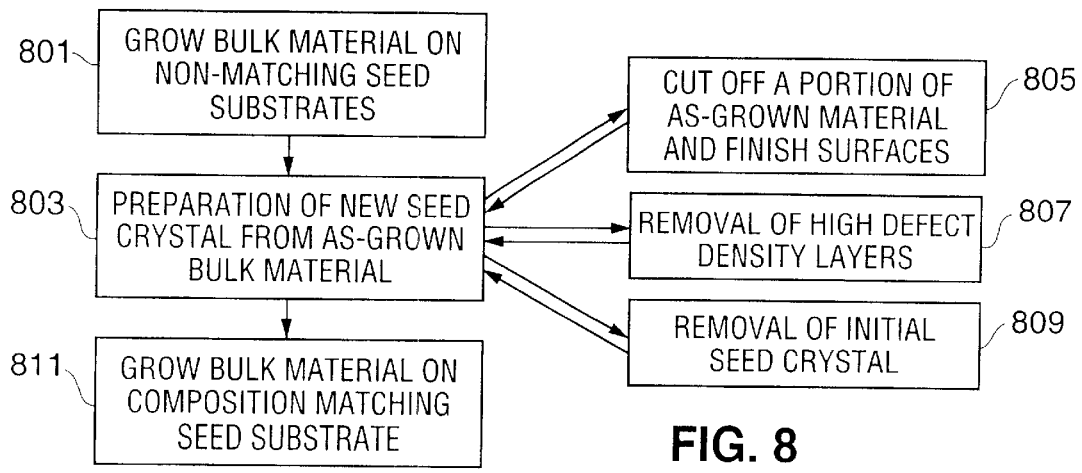
FIG. 8 outlines a process used in at least one embodiment of the invention to grow material with a matching seed crystal.

As previously noted, improved crystal quality in the as-grown material is achieved when the seed crystal and the material to be grown are of the same chemical composition so that there is no crystal lattice or coefficient of thermal expansion mismatch. Accordingly, FIG. 8 outlines a process used in at least one embodiment of the invention in which material is grown using a matching seed crystal.

In the illustrated embodiment of the invention, initially material (e.g., doped or undoped GaN or AlGaN) is grown from a seed crystal of different chemical composition using the techniques described in detail above (step 801). As previously noted, the seed crystal can be of sapphire, silicon carbide, GaAs, or other material. After the bulk material is formed, a portion of the grown crystal is removed from the bulk for use as a new seed crystal (step 803). For example, new seed crystals can be obtained by cutting off a portion of the as-grown bulk (step 805) and subjecting the surfaces of the cut-off portion to suitable surface preparatory steps (step 807). Alternately, prior to cutting up the as-grown bulk material, the initial seed crystal can be removed (step 809), for example using an etching technique. Once a new seed crystal is prepared, the bulk growth process of the present invention is used to grow a second crystal (step 811). However, as a consequence of the ability to grow bulk materials according to the invention, the second growth cycle is able to utilize a seed crystal of the same composition as the material to be grown, thus yielding a superior quality material.

SPECIFIC EMBODIMENTS

Embodiment 1

According to this embodiment of the invention, the modified HVPE process described above was used to grow thick GaN layers on SiC substrates. Suitable GaN substrates were then fabricated and used in conjunction with the modified HVPE process of the invention to grow a GaN single crystal boule. The second GaN boule was cut into wafers suitable for device applications.

In this embodiment, multiple SiC substrates of a 6H polytype were loaded into the growth zone of a reactor similar to that shown in FIG. 1. The substrates were placed on a quartz sample holder with the (0001) Si on-axis surface positioned for GaN deposition. One kilogram of Ga metal was positioned in the source boat within the Ga source tube. After purging the reactor with Ar gas to remove air, the growth zone and the Ga source zone were heated to 1100° C. and 650° C., respectively. The majority of the Ga source, however, was maintained at a temperature of less than 100° C., typically in the range of 30° C. to 40° C. To prepare the substrates for GaN deposition, HCl gas was introduced into the growth zone to etch the SiC substrates. The HCl gas was then introduced into the Ga source zone, thereby forming gallium chloride that was transported into the growth zone by the Ar carrier gas. Simultaneously, $NH_3$ gas was introduced into the growth zone, the $NH_3$ gas providing a source of nitrogen. As a result of the reaction between the gallium chloride and the $NH_3$ gases, a GaN layer was grown on the SiC surface. The $NH_3$ and gallium chloride gases were expelled from the reactor by the flow of the Ar gas. After allowing the growth process to continue for a period of 24 hours, the flow of HCl and $NH_3$ gases was stopped and the furnace was slowly cooled down to room temperature with Ar gas flowing through all of the gas channels. The reactor was then opened to the air and the sample holder was removed. As a result of this growth process, GaN layers ranging from 0.3 to 2 millimeters were grown on the SiC substrates. The range of GaN thicknesses were the result of the distribution of GaN growth rates within the growth zone.

To prepare GaN seed substrates, the SiC substrates were removed from the grown GaN material by chemically etching the material in molten KOH. The etching was carried out in a nickel crucible at a temperature within the range of 450° C. to 650° C. Prior to beginning the etching process, the molten KOH was maintained at the etching temperature for several hours to remove the moisture from the melt and the crucible. Once the substrates were placed within the molten KOH, only a few hours were required to etch away most of the SiC substrates from the grown GaN. This process for substrate removal is favored over either mechanical or laser induced substrate removal. The remaining SiC substrate was removed by reactive ion etching in a $Si_3F/Ar$ gas mixture. For some of the as-grown material, polycrystalline material was noted in the peripheral regions, this material being subsequently removed by grinding. Additionally, in some instances the surface of the as-grown material required mechanical polishing to smooth the surface. In these instances, after the polishing was completed, reactive ion etching or chemical etching was used to remove the thin surface layer damaged during polishing. As a result of this procedure, the desired GaN seeds were obtained. The high quality of the resultant material was verified by the x-ray rocking ω-scan curves (e.g., 300 arc sec for the full width at half maximum (FWHM) for the (0002) GaN reflection). X-ray diffraction measurements showed that the as-grown material was 2H-GaN.

The inventors have found that SiC substrates are preferable over sapphire substrates during the initial growth process as the resultant material has a defined polarity. Specifically, the resultant material has a mixture of gallium (Ga) polarity and nitrogen (N) polarity. The side of the as-grown material adjacent to the SiC substrates has an N polarity while the opposite, outermost layer of the material has a Ga polarity.

Prior to growing a GaN boule utilizing the process of the invention, in some instances the inventors found that it was beneficial to grow a thin GaN layer, e.g., typically in the range of 10 to 100 microns thick, on one or both sides of the GaN substrates grown above. The additional material improved the mechanical strength of the substrates and, in general, prepared the GaN surface for bulk growth. Prior to bulk growth, the GaN seed substrates were approximately 1 millimeter thick and approximately 6 centimeters in diameter.

The growth of the GaN boule used the same reactor as that used to grow the GaN seed substrates. The substrates were positioned within the reactor such that the new material would be grown on the (0001) Ga on-axis face. The inventors have found that the Ga face is preferred over the N face as the resulting boule has better crystal properties and lower dislocation density. It should be noted that the (0001) surface can be tilted to a specific crystallographic direction (e.g., [11–20] and that the tilt angle may be varied between 0.5 and 90 degrees. In the present embodiment, the tilt angle was zero.

In addition to loading the seed substrates into the growth zone of the reactor, two kilograms of Ga was loaded into the source boat within the Ga source tube. After purging the reactor with Ar gas, the growth zone and the Ga source zone were heated to 1050° C. and 650° C., respectively. As previously described, only a small portion of the Ga source was brought up to the high source temperature noted above (i.e., 650° C.). Most of the Ga source was maintained at a temperature close to room temperature, typically in the range of 30° C. and 40° C. Prior to initiating GaN growth, a mixture of $NH_3$ and HCl gas was introduced in the growth zone to refresh the GaN seed surface. As in the growth of the seed crystal previously described, HCl was introduced into the Ga source zone to form gallium chloride that was then transported to the growth zone with Ar gas. At the same time, $NH_3$ gas used as a source of nitrogen was introduced into the growth zone. The GaN was formed by the reaction between the gallium chloride and the $NH_3$ gases.

After approximately 30 minutes of GaN growth, the GaN substrate was moved into a second growth zone maintained at a temperature of approximately 980° C., thereby achieving accelerated growth rates as previously disclosed. This process was allowed to continue for approximately 80 hours. After that, HCl flow through the Ga source tube and $NH_3$ flow though the growth zone were stopped. The furnace was slow cooled down to room temperature with Ar flowing through all gas channels. The reactor was then opened to the air and the sample holder was removed from the reactor. The resultant boule had a diameter of approximately 6 centimeters and a thickness of approximately 1 centimeter. The crystal had a single crystal 2H polytype structure as shown by x-ray diffraction measurements.

After growth, the boule was machined to a perfect cylindrical shape with a 5.08 centimeter diameter (i.e., 2 inch diameter), thereby removing defective peripheral areas. One side of the boule was ground to indicate the (11–20) face. Then the boule was sliced into 19 wafers using a horizontal diamond wire saw with an approximately 200 micron diamond wire. Before slicing, the boule was oriented using an x-ray technique in order to slice the wafers with the (0001) oriented surface. The slicing rate was about 1 millimeter per minute. The wire was rocked around the boule during the slicing.

Thickness of the wafers was varied from 150 microns to 500 microns. Wafer thickness uniformity was better than 5 percent.

After slicing, the wafers were polished using diamond abrasive suspensions. Some wafers were polished only on the Ga face, some wafers were polished only on the N face, and some wafers were polished on both sides. The final surface treatment was performed using a reactive ion etching technique and/or a chemical etching technique to remove the surface layer damaged by the mechanical treatment. The surface of the wafers had a single crystal structure as shown by high energy electron diffraction techniques. The surface of the finished GaN wafers had a mean square roughness, RMS, of 2 nanometers or less as determined by atomic force microscopy utilizing a viewing area of 5 by 5 microns. The defect density was measured using wet chemical etching in hot acid. For different wafers, etch pit density ranged from 10 to 1000 per square centimeter. Some GaN wafers were subjected to heat treatment in an argon atmosphere in a temperature range from 450° C. to 1020° C. in order to reduce residual stress. Raman scattering measurements showed that such heat treatment reduced stress from 20 to 50 percent.

In order to compare the performance of devices fabricated using the GaN substrates fabricated above to those fabricated on SiC and sapphire, GaN homoepitaxial layers and pn diode multi-layer structures were grown. Device structures included AlGaN/GaN structures. Prior to device fabrication, surface contamination of the growth surface of the GaN wafers was removed in a side growth reactor with a $NH_3$-HCl gas mixture. The thickness of individual layers varied from 0.002 micron to 200 microns, depending upon device structure. For example, high frequency device structures (e.g., heterojunction field effect transistors) had layers ranging from 0.002 to 5 microns. For high power rectifying diodes, layers ranged from 1 to 200 microns. In order to obtain p-type layers, a Mg impurity was used while n-type doping was obtained using a Si impurity. The fabricated device structures were fabricated employing contact metallization, photolithography and mesa insulation.

The structures fabricated on the GaN wafers were studied using optical and electron microscopy, secondary ion mass spectrometry, capacitance-voltage and current-voltage methods. The devices showed superior characteristics compared with devices fabricated on SiC and sapphire substrates. Additionally, it was shown that wafer surface cleaning procedure in the reactor reduced defect density, including dislocation and crack density, in the grown epitaxial layers.

Embodiment 2

In this embodiment, a GaN seed was first fabricated as described in Embodiment 1. The 5.08 centimeter diameter (i.e., 2 inch diameter) prepared GaN seed substrates were then placed within a stainless steel, resistively heated furnace and a GaN single crystal boule was grown using a sublimation technique. GaN powder, located within a graphite boat, was used as the Ga vapor source while $NH_3$ gas was used as the nitrogen source. The GaN seed was kept at a temperature of 1100° C. during the growth. The GaN source was located below the seed at a temperature higher than the seed temperature. The growth was performed at a reduced pressure.

The growth rate using the above-described sublimation technique was approximately 0.5 millimeters per hour. After a growth cycle of 24 hours, a 12 millimeter thick boule was grown with a maximum boule diameter of 54 millimeters. The boule was divided into 30 wafers using a diamond wire saw and the slicing and processing procedures described in Embodiment 1. X-ray characterization was used to show that the GaN wafers were single crystals.

Embodiment 3

In this embodiment, bulk GaN material was grown in an inert gas flow at atmospheric pressure utilizing the hot-wall, horizontal reactor described in Embodiment 1. Six 5.08 centimeter diameter (i.e., 2 inch diameter) silicon carbide substrates of a 6H polytype, were placed on a quartz pedestal and loaded into a growth zone of the quartz reactor. The substrates were located such that the (0001) Si on-axis surfaces were positioned for GaN deposition. Approximately 0.9 kilograms of Ga (7N) was located within a quartz boat in the Ga source zone of the reactor. This channel was used for delivery of gallium chloride to the growth zone of the reactor. A second quartz tube was used for ammonia ($NH_3$) delivery to the growth zone. A third separate quartz tube was used for HCl gas delivery to the growth zone.

The reactor was filled with Ar gas, the Ar gas flow through the reactor being in the range of 1 to 25 liters per minute. The substrates were then heated in Ar flow to a temperature of 1050° C. and the hot portion of the metal Ga source was heated to a temperature in the range of 350° C. to 800° C. The lower temperature portion of the Ga source was maintained at a temperature within the range of 30° C. to 40° C. HCl gas was introduced into the growth zone through the HCl channel. As a result, the SiC seed substrates were etched at Ar-HCl ambient before initiating the growth procedure.

To begin the growth process, HCl gas was introduced into the Ga source zone, creating gallium chloride that was delivered to the growth zone by Ar gas flow. Simultaneously, $NH_3$ was introduced into the growth zone. As a result of the reaction between the gallium chloride gas and the ammonia gas, a single crystal epitaxial GaN layer was grown on the substrates. The substrate temperature during the growth process was held constant at 1020° C. After a growth period of 20 hours, the flow of HCl and $NH_3$ were stopped and the samples were cooled in flowing Ar.

As a result of the growth process, six GaN/SiC samples were obtained in which the GaN thickness was in the range of 1 to 3 millimeters. To remove the SiC substrates, the samples were first glued to metal holders using mounting wax (e.g., QuickStick™135) at a temperature of 130° C. with the GaN layer facing the holder. The holders were placed on a polishing machine (e.g., SBT Model 920) and a thick portion of the SiC substrates were ground away using a 30 micron diamond suspension at 100 rpm with a pressure of 0.1 to 3 kilograms per square centimeter. This process was continued for a period of between 8 and 24 hours. After removal of between 200 and 250 microns of SiC, the samples were unglued from the holders and cleaned in hot acetone for approximately 20 minutes.

The residual SiC material was removed from each sample using a reactive ion etching (RIE) technique. Each sample was placed inside a quartz etching chamber on the stainless steel holder. The RIE was performed using $Si_3F/Ar$ for a period of between 5 and 12 hours, depending upon the thickness of the residual SiC. The etching rate of SiC in this process is about 10 microns per hour. After the RIE process was completed, the samples were cleaned to remove possible surface contamination. As a result of the above processes, freestanding GaN plates completely free of any trace of SiC were obtained.

After completion of a conventional cleaning procedure, the GaN plates were placed in the HVPE reactor. A GaN homoepitaxial growth was started on the as-grown (0001) Ga surface of the GaN plates. The growth temperature was approximately 1060° C. After a period of growth of 10 minutes, the samples were cooled and unloaded from the reactor. The GaN layer grown on the GaN plates was intended to cover defects existing in the GaN plates. Accordingly, the samples at the completion of this step were comprised of 5.08 centimeter diameter (i.e., 2 inch diameter) GaN plates with approximately 10 microns of newly grown GaN. Note that for some samples a GaN layer was grown not only on the (0001) Ga face of the GaN plates, but also on the (0001) N face of the plates. Peripheral highly defective regions of the GaN plates were removed by grinding.

Three of the GaN plates from the previous process were loaded into the reactor in order to grow thick GaN boules. Gallium chloride and ammonia gas served as source materials for growth as previously disclosed. In addition, during the growth cycle the GaN boules were doped with silicon supplied to the growth zone by $S_2H_4$ gas. Growth temperatures ranged from 970° C. to 1020° C. and the growth run lasted for 48 hours. Three boules with thicknesses of 5 millimeters, 7 millimeters, and 9 millimeters, respectively, were grown.

The boules were sliced into GaN wafers. Prior to wafer preparation, some of the boules were ground into a cylindrical shape and peripheral polycrystalline GaN regions, usually between 1 and 2 millimeters thick, were removed. Depending upon wafer thickness, which ranged from 150 to 500 microns, between 7 and 21 wafers were obtained per boule. The wafers were then polished on either one side or both sides using an SBT Model 920 polishing machine with a 15 micron diamond suspension at 100 rpm with a pressure of between 0.5 and 3 kilograms per square centimeter for 9 minutes per side. After cleaning all parts and the holder for 5 to 10 minutes in water with soap, the polishing process was repeated with a 5 micron diamond suspension for 10 minutes at the same pressure. After subjecting the parts and the holder to another cleaning, the wafers were polished using a new polishing cloth and a 0.1 micron diamond suspension for an hour at 100 rpm with a pressure of between 0.5 and 3 kilograms per square centimeter.

After cleaning, the GaN wafers were characterized in terms of crystal structure, electrical and optical properties. X-ray diffraction showed that the wafers were single crystal GaN with a 2H polytype structure. The FWHM of the x-ray rocking curve measured in ω-scanning geometry ranged from 60 to 360 arc seconds for different samples. After chemical etching, the etch pit density measured between 100 and 10,000 per square centimeter, depending upon the sample. Wafers had n-type conductivity with a concentration $N_d$-$N_a$ of between 5 and $9 \times 10^{18}$ per cubic centimeter. The wafers were used as substrates for device fabrication, particularly for GaN/AlGaN multi-layer device structures grown by the MOCVD process. Pn diodes were fabricated using a vertical current flow geometry, which was possible due to the good electrical conductivity of the GaN substrates.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A method of growing a GaN single crystal boule, the method comprising the steps of:

growing a GaN single crystal layer on a substrate;

removing said substrate from said GaN single crystal layer;

growing the GaN single crystal boule on a surface of said GaN single crystal layer; and continuing said step of growing the GaN-single crystal boule until the GaN single crystal boule has a length of greater than 1 centimeter.

2. The method of claim 1, wherein said step of growing said GaN single crystal layer on said substrate further comprises the steps of:

locating an extended Ga source within a first source zone of a reactor;

locating said substrate within a growth zone of said reactor;

heating said substrate to a first temperature, wherein said first temperature is greater than 1,000° C.;

heating a first portion of said extended Ga source to a second temperature, wherein said second temperature is greater than 450° C.;

maintaining a second portion of said extended Ga source at a third temperature, wherein said third temperature is greater than 30° C., and wherein said third temperature is less than 100° C.;

introducing a halide reaction gas into said first source zone to form a halide metal compound;

transporting said halide metal compound to said growth zone;

introducing a reaction gas into said growth zone, said reaction gas containing nitrogen; and growing said GaN single crystal layer on said substrate, said GaN single crystal layer formed by said reaction gas reacting with said halide metal compound.

3. The method of claim 2, further comprising the step of selecting a HCl gas as said halide reaction gas, wherein said halide metal compound is comprised of gallium chloride.

4. The method of claim 2, further comprising the step of selecting an ammonia gas as said reaction gas.

5. The method of claim 2, wherein said step of transporting said halide metal compound to said growth zone is further comprised of the step of flowing an inert gas through said first source zone.

6. The method of claim 2, further comprising the steps of:

locating at least one acceptor impurity metal in a second source zone of said reactor;

heating said at least one acceptor impurity metal to a fourth temperature; and transporting said at least one acceptor impurity metal to said growth zone, wherein said GaN single crystal layer contains said at least one acceptor impurity metal.

7. The method of claim 2, further comprising the steps of:

locating at least one donor in a second source zone of said reactor;

heating said at least one donor to a fourth temperature; and transporting said at least one donor to said growth zone, wherein said GaN single crystal layer contains said at least one donor.

8. The method of claim 1, wherein said step of removing said at least one substrate from said GaN single crystal layer further comprises the steps of:

slicing a wafer from said GaN single crystal layer; and polishing said surface of said wafer.

9. The method of claim 8, further comprising the step of etching said polished surface.

10. The method of claim 1, wherein said step of removing said substrate from said GaN single crystal layer further comprises the step of etching said substrate from said GaN single crystal layer to expose said surface of said GaN single crystal layer.

11. The method of claim 10, wherein said etching step further comprises the step of placing said substrate with said GaN single crystal layer into a crucible containing molten KOH.

12. The method of claim 11, further comprising the step of reactive ion etching said exposed surface, said reactive ion etching step proceeding after the step of removing said substrate from said crucible of molten KOH.

13. The method of claim 10, further comprising the step of polishing said exposed surface.

14. The method of claim 13, further comprising the step of reactive ion etching said polished, exposed surface.

15. The method of claim 13, further comprising the step of chemically etching said polished, exposed surface.

16. The method of claim 1, wherein said step of removing said at least one substrate from said GaN single crystal layer further comprises the steps of:

polishing said substrate, wherein a first portion of said substrate is removed from said GaN single crystal layer through said polishing step; and reactive ion etching said substrate, wherein a second portion of said substrate is removed from said GaN single crystal layer through said reactive ion etching step.

17. The method of claim 16, wherein said reactive ion etching step uses an $Si_3F/Ar$ mixture.

18. The method of claim 1, wherein said step of growing the GaN single crystal boule on said surface of said GaN single crystal layer further comprises the steps of:

locating an extended Ga source within a first source zone of a reactor;

locating said GaN single crystal layer within a growth zone of said reactor;

heating said GaN single crystal layer to a first temperature, wherein said first temperature is greater than 1,000° C.;

heating a first portion of said extended Ga source to a second temperature, wherein said second temperature is greater than 450° C.;

maintaining a second portion of said extended Ga source at a third temperature, wherein said third temperature is greater than 30° C., and wherein said third temperature is less than 100° C.;

introducing a halide reaction gas into said first source zone to form a halide metal compound;

transporting said first halide metal compound to said growth zone;

introducing a reaction gas into said growth zone, said reaction gas containing nitrogen;

growing a first portion of the GaN single crystal boule on said GaN single crystal layer, said first portion of the GaN single crystal boule formed by said reaction gas reacting with said first halide metal compound;

continuing said growing step for at least 10 minutes;

heating said GaN single crystal layer to a fourth temperature, wherein said fourth temperature is greater than 850° C. and less than 1,000° C.;

growing a second portion of the GaN single crystal boule, said second portion of the GaN single crystal boule formed by said reaction gas reacting with said first halide metal compound; and continuing said step of growing said second portion of the GaN single crystal boule for at least 12 hours.

19. The method of claim 18, wherein said step of transporting said first halide metal compound to said growth zone is further comprised of the step of flowing an inert gas through said first source zone.

20. The method of claim 18, further comprising the step of selecting a HCl gas as said halide reaction gas, and wherein said first halide metal compound is comprised of gallium chloride.

21. The method of claim 18, further comprising the step of selecting an ammonia gas as said reaction gas.

22. The method of claim 18, further comprising the steps of:

locating at least one acceptor impurity metal in a second source zone of said reactor;

heating said at least one acceptor impurity metal to a fifth temperature; and transporting said at least one acceptor impurity metal to said growth zone, wherein said GaN single crystal boule contains said at least one acceptor impurity metal.

23. The method of claim 18, further comprising the steps of:

locating at least one donor in a second source zone of said reactor;

heating said at least one donor to a fifth temperature; and transporting said at least one donor to said growth zone, wherein said GaN single crystal boule contains said at least one donor.

24. The method of claim 1, wherein said step of growing the GaN single crystal boule on said surface of said GaN single crystal layer further comprises the steps of:

locating said GaN single crystal layer within a furnace;

locating a GaN source within a graphite boat within said furnace;

coupling a supply of $NH_3$ gas to said furnace;

heating said GaN single crystal layer to a first temperature greater than 1,000° C.;

heating said GaN source to a second temperature, wherein said second temperature is greater than said first temperature; and growing the GaN single crystal boule on said GaN single crystal layer through a sublimation process.

25. The method of claim 24, wherein said heating steps are performed using at least one resistive heater.

26. The method of claim 24, further comprising the step of positioning said GaN source below said GaN single crystal layer in said furnace.

27. A method of growing a GaN single crystal boule, the method comprising the steps of:

growing a GaN single crystal layer on a substrate;

removing said substrate from said GaN single crystal layer;

growing the GaN single crystal boule on a surface of said GaN single crystal layer utilizing a modified HVPE process and an extended, multi-temperature zone Ga source; and continuing said step of growing the GaN single crystal boule until the GaN single crystal boule has a volume in excess of 4 cubic centimeters, and wherein an x, ay, and a z dimension of said GaN single crystal boule each exceed 1 centimeter.

* * * * *

UNITED STATES PATENT AND TRADEMARK OFFICE
CERTIFICATE OF CORRECTION

PATENT NO. : 6,616,757 B1
DATED : September 9, 2003
INVENTOR(S) : Melnik et al.

It is certified that error appears in the above-identified patent and that said Letters Patent is hereby corrected as shown below:

<u>Title page,</u>
Item [63], Related U.S. Application Data, should read:

-- [63] Continuation of application no. 09/900,833, field on July 6, 2001, issued as U.S. Patent No. 6,613,143 --

Signed and Sealed this

Fourth Day of May, 2004

JON W. DUDAS
*Acting Director of the United States Patent and Trademark Office*